United States Patent
Andriessen

(10) Patent No.: US 7,307,276 B2
(45) Date of Patent: Dec. 11, 2007

(54) LAYER CONFIGURATION COMPRISING AN ELECTRON-BLOCKING ELEMENT

(75) Inventor: Hieronymus Andriessen, Beerse (BE)

(73) Assignee: Agfa-Gevaert, Mortsel (BE)

( * ) Notice: Subject to any disclaimer, the term of this patent is extended or adjusted under 35 U.S.C. 154(b) by 780 days.

(21) Appl. No.: 10/641,524

(22) Filed: Aug. 15, 2003

(65) Prior Publication Data

US 2004/0040594 A1  Mar. 4, 2004

Related U.S. Application Data

(60) Provisional application No. 60/409,793, filed on Sep. 11, 2002.

(30) Foreign Application Priority Data

Aug. 23, 2002  (EP) ................................. 02102215

(51) Int. Cl.
*H01L 51/52* (2006.01)
(52) U.S. Cl. .................... 257/40; 428/690; 136/243
(58) Field of Classification Search .............. 257/40; 428/690; 136/243
See application file for complete search history.

(56) References Cited

U.S. PATENT DOCUMENTS 4,175,982 A   11/1979  Loutfy et al.
6,206,937 B1   3/2001  Kudoh et al.
2002/0098377 A1*  7/2002  Cao et al. .................. 428/690

FOREIGN PATENT DOCUMENTS

| DE | 198 39 948 A1 | 3/2000 |
| EP | 0 728 745 A1 | 8/1996 |
| JP | 04 085389 A | 3/1992 |
| JP | 04 198389 A | 7/1992 |
| JP | 04 293972 A | 10/1992 |
| WO | WO 00/06665 A1 | 2/2000 |
| WO | WO 00/65653 A1 | 11/2000 |
| WO | WO 01/78464 A1 | 10/2001 |

OTHER PUBLICATIONS

Lee et al.; *Advanced Materials*, vol. 13 (16), 1274-1278, (Aug. 2001).
Lee et al; *J. of Applied Physics*, vol. 90 (5), 2128-2134 (Sep. 2001).
Search Report for EP 02 10 2215 (Jan. 27, 2003).

* cited by examiner

*Primary Examiner*—Nam Nguyen
*Assistant Examiner*—Anthony Fick
(74) *Attorney, Agent, or Firm*—Leydig, Voit & Mayer, Ltd

(57) ABSTRACT

A layer configuration on a support, the layer configuration comprising a non-photoactive element exclusive of unsubstituted poly(3,4-alkylenedioxythiophene)s, the element containing at least one polymer selected from the group consisting of polycarboxy-polymers, optionally quaternized polyamine-polymers and poly(vinylphosphonic acid), the surface of one side of the element being contiguous with a positive electrode and the surface on the opposite side of the element being contiguous with a material capable of transporting holes.

10 Claims, 1 Drawing Sheet

LAYER CONFIGURATION COMPRISING AN ELECTRON-BLOCKING ELEMENT

Figure 1:
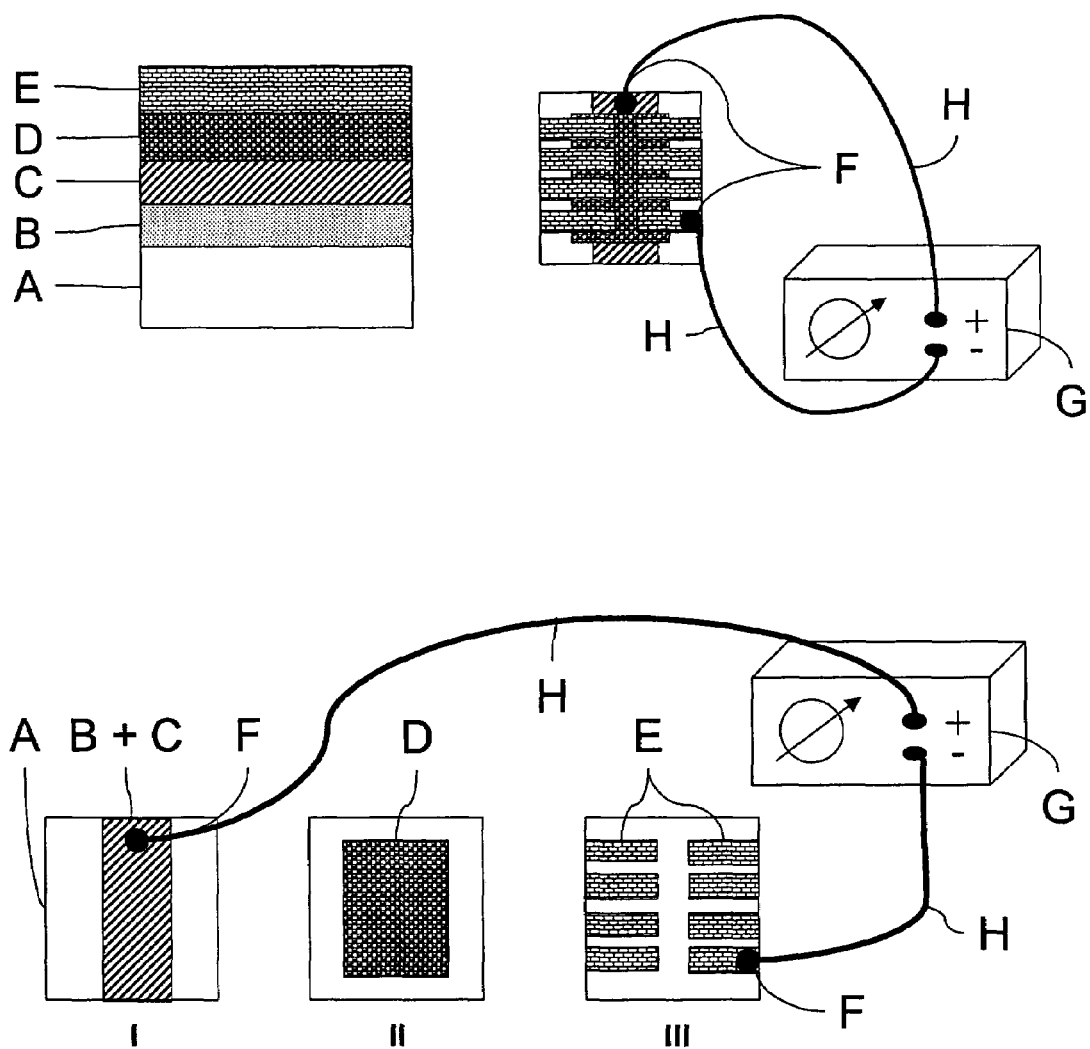

This application claims the benefit of U.S. Provisional Application No. 60/409,793 filed Sep. 11, 2002, which is incorporated by reference. In addition, this application claims the benefit of European Application No. 02102215.7 filed Aug. 23, 2002, which is also incorporated by reference.

FIELD OF THE INVENTION

The present invention relates to a layer configuration comprising an electron-blocking element.

BACKGROUND OF THE INVENTION

U.S. Pat. No. 4,175,982 discloses a photovoltaic device comprising a first, ohmic electrode and a second barrier electrode and sandwiched therebetween a photoactive layer comprising metal-free phthalocyanine dispersed in an electrically insulating binder, e.g. poly(N-vinyl carbazole), polyvinylacetate, polycarbonate, polystyrene, polystyrene acrylonitrile copolymer and polyacrylonitrile, wherein the barrier electrode comprises a metal the oxide of which is electrically conductive.

WO 00/06665 discloses an electroluminescent device comprising a light-emitting organic film, arranged between an anode material and a cathode material such that under an applied voltage, the device is forward biased and holes are injected from the anode material into the organic film adjacent to the anode material and electrons are injected from the cathode material into the organic film adjacent to the cathode material, resulting in light emission from the light-emitting organic film; wherein the device additionally comprises a solution-processed film of a blend of an acid-functional nonconductive polymer e.g. polymers having pendant groups selected from sulfonic acid, sulfinic acid, carboxylic acid, phosphoric acid, phosphonic acid, phosphinic acid, and $-N+(R)^2H$ where R is selected from hydrogen, $C_1$-$C_{20}$ hydrocarbyl, hydroxy, alkoxy, and aryloxy, and a conductive polymer positioned between the anode material and the light-emitting organic film, wherein the weight ratio of non-conducting to conducting polymer is at least 0.75:1. WO 00/0665 specifically discloses the following non-conductive polymers: sulfonated polyphenylenes, polyphenylenes bearing carboxylic acid functional groups, poly(styrene sulfonic acid), poly(2-acrylamido-2-methyl-1-propanesulfonic acid), polyacrylic acid, polymethacrylic acid or a mixture thereof.

WO 01/78464 discloses in an organic/polymer electroluminescent (EL) device which comprises: a transparent substrate; a semitransparent electrode deposited on the transparent substrate; a hole-injecting layer positioned on the semitransparent electrode; an emissive layer made of an organic EL-material, positioned on the hole-injecting layer; and electron-injecting layer positioned on the electron-injecting layer, the improvement comprising that single-ion conductors are employed for the hole-injecting layer and the electron-injecting layer. The specification does not define the meaning of the term "single-ion conductor", which in plain language means a conductor of a single ion, although claim 9 teaches that the single ion conductor can be a single-cation conductor or a single anion conductor and claim 10 teaches that such single ion conductors can be represented as a general formula (I) or (II), comprising ether chain $[(-CH_2)_nO-]$ such as polyethylene oxide or polypropylene oxide in the main chain, and contains anions such as $SO_3^-$, $COO^-$ or $I^-$ in the main side chains that form ionic bonds with counter ions such as $Na^+$, $Li^+$, $Zn^{2+}$, $Mg^{2+}$, $Eu^{3+}$, or $(NH_3)_4^+$:

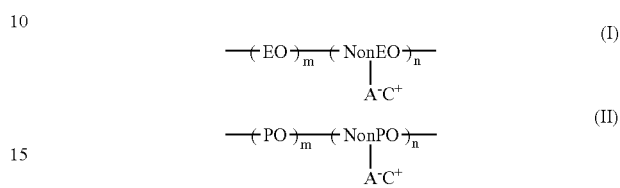

wherein, EO represents ethylene oxide; Non-EO represents nonethylene oxide; PO represents propylene oxide; Non-PO represents non-propylene oxide; $A^-$ represents anion; $C^+$ represents cation; m+n=1 1 and n represents a real number more than 0 and less than 1.

In 2001 T.-W. Lee and O. O. Park disclosed in Advanced Materials, volume 13, pages 1274-1278, polymer light-emitting energy-well devices using single-ion conductors (SIC's) in which charge injection and its confinement simultaneously in EL devices is striven for by using both a single-cationic conductor (SCC) and a single-anionic conductor (SAC), which "greatly improve the charge injection due to accumulation of the mobile ions near the electrodes" with the aim of "confining well-electrons and holes leading to enhanced recombination rate of the pairs" in devices in which "the mobile ions to play a key role in improvement of charge injection are separately located near both electrodes in the structure of a sandwiched multi-layer device instead of blending with the emitting material so that the problem of phase separation of the emitting materials can be avoided". They further disclose that ionic polyurethane possesses good mechanical properties and high ionic conductivity with a single-ion transport character and that SIC's are generally of two different types: one is a polymer blend of an ionomer and polyether which usually possesses poor mechanical properties and the other is the copolymer of an oligomeric ionomer with polyether. They also disclosed that incorporation of the SIC's with soft and hard blocks into the EL devices dramatically improves not only luminance but also the efficiency and that SCC's possess electron-injecting and hole-blocking properties and SAC's possess hole-injecting and electron-blocking properties.

In 2001 T.-W. Lee et al. disclosed in Journal of Applied Physics, volume 90, pages 2128-2134, a study of the effect of ion concentration, neutralization level and counterions in ionomers to obtain the optimal electroluminescent (EL) characteristics in polymer light-emitting diodes using pol[2-methoxy-5-(2'-ethylhexyloxy)-1,4-phenylenevinylene] (MEH-PPV) for the emissive layer and sulphonated polystyrene (SPS) ionomers for the electron-injecting layer.

A general problem in electronic devices, particularly in light emitting diodes, is undesirable hole-electron recombination at the positive electrode thereby reducing the efficiency and lifetime of the device.

ASPECTS OF THE INVENTION

It is therefore an aspect of the present invention to provide an element between a positive electrode and a material capable of hole transport, which is capable of reducing hole-electron recombination at the positive electrode thereby increasing the efficiency and lifetime of electronic devices containing such layer configurations.

Further aspects and advantages of the invention will become apparent from the description hereinafter.

SUMMARY OF THE INVENTION

It has been surprisingly found that the use of an element containing an organic polymer containing covalently bonded sulphonic acid groups, sulphate groups, carboxy groups, optionally quaternized amine groups or phosphonic acid groups between a positive electrode and a material capable of hole transport improves the device performance by increasing the lifetime.

Aspects of the present invention are realized by a layer configuration on a support, the layer configuration comprising a non-photoactive element exclusive of unsubstituted poly(3,4-alkylenedioxythiophene)s, the element containing at least one polymer selected from the group consisting of polycarboxy-polymers, optionally quaternized polyamine-polymers and poly(vinylphosphonic acid), the surface of one side of the element being contiguous with a positive electrode and the surface on the opposite side of the element being contiguous with a material capable of transporting holes.

Preferred embodiments are disclosed in the dependent claims.

DETAILED DESCRIPTION OF THE INVENTION

FIG. 1 is a schematic representation of a side view and a top view of the layer configuration used in devices 2 to 9, 11 to 16 and 18 to 26 and the circuit used for obtaining electroluminescence in which:

A represents a poly(ethylene terephthalate) support;
B represents an sputtered ITO layer;
C represents an electron blocking layer;
D represents an electroluminescent layer containing ZnS:Cu nanoparticles and a binder;
E represents an evaporated aluminium electrode
F represents conductive silver paste dots for contacting
G represents IV-power source (Power Supply ES 030-5 of Delta Elektronica)
H represents electric conductive copper wires
I indicates the first layer
II indicates the second layer
III indicates the third layer

DEFINITIONS

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethylropyl, 2,2-dimethylpropyl and 2-methyl-butyl etc.

The term aqueous for the purposes of the present invention means containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methyl pyrrolidone; methoxypropanol; and ketones e.g. 2-propanone and 2-butanone etc.

The term element as used in disclosing the present invention means a single layer containing one or more polymers selected from the group consisting of polycarboxy-polymers, optionally quaternized polyamine-polymers and poly(vinylphosphonic acid) or two contiguous layers wherein the innermost layer of the element with respect to the support contains at least one polymer selected from the group consisting of polycarboxy-polymers, optionally quaternized polyamine-polymers and poly(vinylphosphonic acid) and the outermost layer with respect to the support contains at least one polymer selected from the group consisting of polycarboxy-polymers, optionally quaternized polyamine-polymers and poly(vinylphosphonic acid, which is different from the polymers selected from the group consisting of polycarboxy-polymers, optionally quaternized polyamine-polymers and poly(vinylphosphonic acid) in the innermost layer with respect to the support.

The term "non-photoactive element" as used in disclosing the present invention means an element which is not photoactive, where photoactive means either capable of reacting to light or capable of emitting light.

The term poly(3,4-alkylenedioxythiophene) as used in disclosing the present invention means a polythiophene in which the 3 and 4 positions in the thiophene ring are linked by a —O-alkylene-O— group, where the term alkylene means a saturated hydrocarbon group containing the carbon atoms linking the two oxygen atoms in the —O-alkylene-O— group and also saturated hydrocarbon groups containing the carbon atoms linking the two oxygen atoms in the —O-alkylene-O— group in which these carbon atoms are covalently linked with one or more alkyl groups e.g. poly (3,4-ethylenedioxythiophene), poly[3,4-(1,2-propylene)dioxythiophene] and poly[3,4-(1,3-propylene)dioxythiophene].

The term polycarboxy-polymer as used in disclosing the present invention means a polymer with more than one carboxylic acid group.

The term polysulfato-polymer as used in disclosing the present invention means a polymer with more than one hydrogen sulfate group.

The term polysulfo-polymer as used in disclosing the present invention means a polymer with more than one sulphonic acid groups.

The term polymer includes homopolymers, copolymers, terpolymers, graft polymers and block copolymers and both chain and condensation polymers.

The passage "material capable of transporting holes" as used in disclosing the present invention means a material into which holes can be injected and through which holes can be transported, such a material preferably having a hole mobility >$10^{-8}$ cm$^2$ V$^{-1}$ s$^{-1}$ and particularly preferably having a hole mobility >$10^{-6}$ cm$^2$ V$^{-1}$ s$^{-1}$ as measured by time of flight techniques or in a field effect transistor.

The term conductive polymer as used in disclosing present invention is a polymer in a state such that it has a specific conductivity of at least $10^{-6}$ S/cm and preferably a specific conductivity of at least $10^{-4}$ S/cm.

The abbreviation HTs represents p-toluenesulphonic acid and Ts$^-$ or tosylate represents p-toluenesulphonate.

Layer Configuration

Aspects of the present invention are realized with a layer configuration on a support, the layer configuration comprising a non-photoactive element exclusive of unsubstituted poly(3,4-alkylenedioxythiophene)s, the element containing at least one polymer selected from the group consisting of polycarboxy-polymers, optionally quaternized polyamine-polymers and poly(vinylphosphonic acid), the surface of one side of the element being contiguous with a positive electrode and the surface on the opposite side of the element being contiguous with a material capable of transporting holes. Polyvinyphosphonic acid has the following formula:

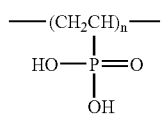

and is supplied by Hoechst.

According to a first embodiment of the layer configuration, according to the present invention, the at least one polymer is a copolymer with a non-carboxy, non-amino, non-sulphato, non-sulpho, non-vinylphosphonic acid containing comonomer.

According to a second embodiment of the layer configuration, according to the present invention, the thickness of the element is between 1 and 20 nm.

According to a third embodiment of the layer configuration, according to the present invention, the at least one polymer is a copolymer with a non-carboxy, non-amino, non-sulphato, non-sulpho, non-vinylphosphonic acid containing comonomer and the thickness of the element is between 1 and 20 nm.

According to a fourth embodiment of the layer configuration, according to the present invention, the element is exclusive of a conductive polymer.

According to a fifth embodiment of the layer configuration, according to the present invention, the layer configuration is a transistor.

The element is preferably prepared by spincoating the coating or coatings from aqueous or solvent media. Solutions or dispersions for spincoating preferably have viscosities of about 2 to 3 cP meaning that up to 95% of the solution is spun off i.e. not deposited during the spincoating process. If the element is prepared by the application of two coatings the first coating is preferably dried in a drying cupboard before the second coating is applied. Depending upon the ingredients and solvents/dispersion media used in the two coatings the two coatings will form a single homogeneous layer after the second coating or two identifiable layers.

Polycarboxy-polymers

Aspects of the present invention are realized with a layer configuration on a support, the layer configuration comprising a non-photoactive element exclusive of unsubstituted poly(3,4-alkylenedioxythiophene)s, the element containing a polycarboxypolymer, the surface of one side of the element being contiguous with a positive electrode and the surface on-the opposite side of the element being contiguous with a material capable of transporting holes.

Polycarboxy-polymers, according to the present invention, may be vinylpolymers, condensation polymers or optionally modified natural products such as carbohydrates, e.g. carboxymethyl-cellulose and proteins, e.g. gelatin.

According to a sixth embodiment of the layer configuration, according to the present invention, the polycarboxypolymer is a polymer containing optionally substituted acrylic acid monomer units.

According to a seventh embodiment of the layer configuration, according to the present invention, the polycarboxypolymer is a polymer containing optionally substituted acrylic acid monomer units selected from the group consisting of: acrylic acid, methacrylic acid, maleic acid, fumaric acid, itaconic acid, glutaconic acid and citraconic acid.

According to an eighth embodiment of the layer configuration, according to the present invention, the polycarboxypolymer is polyacrylic acid or polymethacrylic acid.

Suitable polycarboxy-polymers include:

| | Composition | |
|---|---|---|
| PCP-01 | polyacrylic acid | SOKALAN ™ PA25 from BASF |
| PCP-02 | polymethacrylic acid | |
| PCP-03 | copolymer of 80% by weight ethyl acrylate and 20% by weight methacrylic acid | |
| PCP-04 | terpolymer of 50% by weight ethyl acrylate, 33.5% by weight methyl methacrylate and 16.5% by weight methacrylic acid | |
| PCP-05 | copolymer of 50% by weight maleic anhydride and 50% by weight styrene | |
| PCP-05 | gelatin | |
| PCP-06 | carboxymethyl-cellulose | |

Polyamine-polymers

Aspects of the present invention are realized by a layer configuration on a support, the layer configuration comprising a non-photoactive element exclusive of unsubstituted poly(3,4-alkylenedioxythiophene)s, the element containing an optionally quaternized polyamine-polymer, the surface of one side of the element being contiguous with a positive electrode and the surface on the opposite side of the element being contiguous with a material capable of transporting holes.

Optionally quaternized polyamine-polymers include both optionally quaternized aliphatic polyamine-polymers, e.g. polyallylamine hydrochloride and polymers with optionally quaternized nitrogen-containing heteroaromatic groups, e.g. homopolymers and copolymers of optionally substituted vinylpyridines, vinyldipyridyls, vinylquinolines, vinylisoquinolines, vinylacridines, vinylpyridazines, vinylpyrimidines, vinylpyrazines, vinyltriazine, vinylcinnolines, vinylphthalazines, vinylquinazolines, vinylquinoxalines, vinylpteridines, vinyloxadiazole and vinyloxazole.

According to a ninth embodiment of the layer configuration, according to the present invention, the optionally quaternized polyamine-polymer is polyallylamine hydrochloride, an optionally quaternized polyvinylpyridine or a copolymer of an optionally quaternized vinyl pyridine.

According to a tenth embodiment of the layer configuration, according to the present invention, the optionally quaternized polyamine-polymer is an optionally quaternized polyamine homopolymer, e.g. an optionally quaternized polyallylamine or an optionally quaternized polyvinylpyridine, and the thickness of the element is between 50 and 200 nm.

According to an eleventh embodiment of the layer configuration, according to the present invention, the optionally quaternized polyamine-polymer is an optionally quaternized polyamine copolymer, e.g. an optionally quaternized copolymer of vinyl pyridine, and the thickness of the element is between 1 and 20 nm.

Suitable polyamine-polymers, according to the present invention, include:

| | Composition | |
|---|---|---|
| PAP-01 | polyallylamine hydrochloride | from Nitto |
| PAP-02 | poly (4-vinylpyridine) | IONAC ™ PP200X from IONAC CHEM. CORP. |
| PAP-03 | copolymer of 28.5 mol % acrylamide and 71.5 mol % 4-vinylpyridine | |
| PAP-04 | terpolymer of 83.5 mol % acrylamide, 15 mol % 4-vinylpyridine and 1.5 mol % N-vinylimidazole | |
| PAP-05 | copolymer of 10% by weight n-butyl acrylate and 90% by weight of 4-vinylpyridine | from Aldrich |
| PAP-06 | copolymer of 10% by weight styrene and 90% by weight 4-vinylpyridine | from Aldrich |
| PAP-07 | poly (2-vinylpyridine) | |
| PAP-08 | copolymer of 30% by weight styrene and 70% by weight 2-vinylpyridine | from Aldrich |
| PAP-09 | poly (4-vinylquinoline) | |
| PAP-10 | Poly (6-vinylisoquinoline) | |

Surfactants

According to a twelfth embodiment of the layer configuration, according to the present invention, the element further contains a surfactant.

According to a thirteenth embodiment of the layer configuration, according to the present invention, the element further contains a non-ionic surfactant e.g. ethoxylated/fluoroalkyl surfactants, polyethoxylated silicone surfactants, polysiloxane/polyether surfactants, ammonium salts of perfluoroalkylcarboxylic acids, polyethoxylated surfactants and fluorine-containing surfactants.

Suitable non-ionic surfactants include:

Surfactant no. 01=ZONYL™ FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL™ FSN-100: $F(CF_2CF_2)_{1-9}CH_2CH_2O(CH_2CH_2O)_xH$ where x=0 to about 25, from DuPont;

Surfactant no. 03=ZONYL™ FS300, a 40% by weight aqueous solution of a fluorinated surfactant, from DuPont;

Surfactant no. 04=ZONYL™ FSO, a 50% by weight solution of a mixture of ethoxylated non-ionic fluoro-surfactant with the formula:

$F(CF_2CF_2)_{1-7}CH_2CH_2O(CH_2CH_2O)_yH$ where y=0 to ca. 15 in a 50% by weight solution of ethylene glycol in water, from DuPont;

Surfactant no. 05=ZONYL™ FSO-100, a mixture of ethoxylated nonionic fluoro-surfactant from DuPont with the formula: $F(CF_2CF_2)_{1-7}CH_2CH_2O(CH_2CH_2O)_yH$ where y=0 to ca. 15 from DuPont;

Surfactant no. 06=Tegoglide™ 410, a polysiloxane-polymer copolymer surfactant, from Goldschmidt;

Surfactant no. 07=Tegowet™, a polysiloxane-polyester copolymer surfactant, from Goldschmidt;

Surfactant no. 08=FLUORAD™FC431: $CF_3(CF_2)_7SO_2(C_2H_5)N—CH_2CO—(OCH_2CH_2)_nOH$ from 3M;

Surfactant no. 09=FLUORAD™FC126, a mixture of the ammonium salts of perfluorocarboxylic acids, from 3M;

Surfactant no. 10=Polyoxyethylene-10-lauryl ether

Surfactant no. 11=FLUORAD™FC430, a 98.5% active fluoroaliphatic ester from 3M;

According to a fourteenth embodiment of the layer configuration, according to the present invention, the element further contains an anionic surfactant.

Suitable anionic surfactants include:

Surfactant no. 12=ZONYL™ 7950, a fluorinated surfactant, from DuPont;

Surfactant no. 13=ZONYL™ FSA, 25% by weight solution of $F(CF_2CF_2)_{1-9}CH_2CH_2SCH_2CH_2COOLi$ in a 50% by weight solution of isopropanol in water, from DuPont;

Surfactant no. 14=ZONYL™ FSE, a 14% by weight solution of $[F(CF_2CF_2)_{1-7}CH_2CH_2O]_xP(O)\ (ONH_4)_y$ where x=1 or 2; y=2 or 1; and x+y=3 in a 70% by weight solution of ethylene glycol in water, from DuPont;

Surfactant no. 15=ZONYL™ FSJ, a 40% by weight solution of a blend of $F(CF_2CF_2)_{1-7}CH_2CH_2O]_xP(O)\ (ONH_4)_y$, where x=1 or 2; y=2 or 1; and x+y=3 with a hydrocarbon surfactant in 25% by weight solution of isopropanol in water, from DuPont;

Surfactant no. 16=ZONYL™ FSP, a 35% by weight solution of $[F(CF_2CF_2)_{1-7}CH_2CH_2O]_xP(O)\ (ONH_4)_y$ where x=1 or 2; y=2 or 1 and x+y=3 in 69.2% by weight solution of isopropanol in water, from DuPont;

Surfactant no. 17=ZONYL™ UR: $[F(CF_2CF_2)_{1-7}CH_2CH_2O]_xP(O)\ (OH)_y$ where x=1 or 2; y=2 or 1 and x+y=3, from DuPont;

Surfactant no. 18=ZONYL™ TBS: a 33% by weight solution of $F(CF_2CF_2)_{3-8}CH_2CH_2SO_3H$ in a 4.5% by weight solution of acetic acid in water, from DuPont;

Surfactant no. 19=ammonium salt of perfluoro-octanoic acid from 3M

Binder

According to a fifteenth embodiment of the layer configuration, according to the present invention, the element further contains a binder.

Crosslinking Agent

According to a sixteenth embodiment of the layer configuration, according to the present invention, the element further contains a cross-linking agent.

Electroluminescent Phosphors

According to a seventeenth embodiment of the layer configuration, according to the present invention, the layer configuration further comprises a layer of an electroluminescent phosphor.

According to an eighteenth embodiment of the layer configuration, according to the present invention, the layer configuration further comprises a layer of an electroluminescent phosphor, wherein the electroluminescent phosphor belongs to the class of II-VI semiconductors e.g. ZnS, or is a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce.

According to a nineteenth embodiment of the layer configuration, according to the present invention, the layer configuration further comprises a layer of an electroluminescent phosphor, wherein the electroluminescent phosphor is ZnS doped with manganese, copper or terbium, or $CaGa_2S_4$ doped with cerium.

Dielectric Layer

According to a twentieth embodiment of the layer configuration, according to the present invention, the layer configuration further comprises a dielectric layer.

Any dielectric material may be used in the dielectric layer, with yttria and barium titanate being preferred e.g. the barium titanate paste LUXPRINT™ type 7153E high K dielectric insulator supplied by DuPont and the barium titanate paste ELECTRODAG™ EL-040 supplied by Acheson. A positive ion exchanger may be incorporated into the dielectric layer to capture any ions dissolving escaping from the phosphor of the light-emitting layer. The amount of ion exchanger in the dielectric layer has to be optimized so that it has a maximum effectiveness in reducing black spots while not reducing the initial brightness level. It is therefore preferred to add 0.5 to 50 parts by weight of ion exchanger to 100 parts by weight of the total amount of resin and dielectric material in the dielectric layer. The ion exchanger may be organic or inorganic.

Suitable inorganic ion exchangers are hydrated antimony pentoxide powder, titanium phosphate, salts of phosphoric acid and silicic acid and zeolite.

Support

According to a twenty-first embodiment of the layer configuration, according to the present invention, the support is transparent or translucent.

According to a twenty-second embodiment of the layer configuration, according to the present invention, the support is paper, polymer film, glass or ceramic.

According to a twenty-third embodiment of the layer configuration, according to the present invention, the support is a transparent or translucent polymer film.

A transparent or translucent support suitable for use with the electroconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate) or poly(ethylene naphthalene-1,4-dicarboxylate) being particularly preferred.

Electroluminescent Devices

According to a twenty-fourth embodiment of the layer configuration, according to the present invention, the layer configuration is an electroluminescent device.

According to a twenty-fifth embodiment of the layer configuration, according to the present invention, the layer configuration is a light emitting diode.

Thin film electroluminescent devices (ELDs) are all characterized by one (or more) electroluminescent active layer(s) sandwiched between two electrodes. Optionally a dielectric layer may also be part of the sandwich.

Thin film ELDs can be subdivided into organic and inorganic based ELDS. Organic-based thin film ELDs can be subdivided into low molecular weight organic devices including oligomers (Organic Light Emitting Diodes (OLEDs)) and high molecular weight organic devices (Polymer Light Emitting Diodes (PLEDs)). The inorganic ELDs on the other hand can be further subdivided into the High Voltage Alternating Current (HV-AC) ELDs and the Low Voltage Direct Current (LV-DC) ELDs. The LV-DC ELDs include Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10-50 nm thick and applied by vacuum deposition, whereas for PLEDs the hole transporting layer is usually about 40 nm thick and the luminescent layer is usually about 100 nm thick and applied by spin coating or other non-vacuum coating techniques. A direct voltage of 5-10 V is applied between both electrodes and light emission results from holes and electrons being injected from the positive and negative electrodes respectively combining in the luminescent layer thereby producing the energy to excite the luminescent species to emit light.

In OLEDs the hole transporting layer and electroluminescent layer consist of low molecular organic compounds, N,N'-diphenyl1,1'-biphenyl-4,4'-diamine (TPD) can, for example be used as the hole transporter and aluminium (III) 8-hydroxyquinoline complex ($Alq_3$), polyaromatics (anthracene derivatives, perylene derivatives and stilbene derivatives) and polyhetero-aromatics (oxazoles, oxadiazoles, thiazoles etc.) can be used as electroluminescent compounds.

In PLEDs electroluminescent compounds that can be used are polymers like the non-conjugated polyvinylcarbazole derivatives (PVK) or conjugated polymers like poly(p-phenylene vinylenes) (PPV), polyfluorenes, poly(3-alkylthiophene), poly(p-phenylene ethynylenes) etc. These high-molecular-weigth materials allow for the easy preparation of thin films by casting, and show a high resistance to crystallization.

Low voltage DC PEL Devices generally comprise a transparent substrate, a transparent conductor (ITO), a doped ZnS phosphor layer (20 µm), and a top electrode of evaporated aluminium. The phosphor layer is applied by means of the doctor blade technique or screen printing on an ITO conducting layer. Subsequently an aluminium electrode is applied by evaporation. Upon applying a direct current voltage of several volts (ITO positive), holes start moving towards the aluminium electrode, thereby creating an insulating region (about 1 µm in thickness) next to the ITO layer within one minute or so. This results in a current drop which is associated with the onset of light emission. This process has been called the forming process. In the thin high resistive phosphor layer thereby formed, high electric fields occur and electroluminescence is already possible at low voltages (typically between 10 and 30 V). Que et al. [see Appl. Phys. Lett., volume 73, pages 2727-2729 (1998)] using ZnS:Cu nano crystals achieved turn on voltages of below 5 V.

In hybrid LEDs, inorganic emitting so-called quantum dots are used in combination with organic polymers with charge transporting properties and in some cases also emitting properties. Hybrid LEDs with CdSe nano particles have been reported by Colvin et al. [see Nature, volume 370, pages 354-357, (1994)], Dabbousi et al. [see Appl. Phys.

Lett., volume 66, pages 1316-1318 (1995), and Gao et al. [see J. Phys. Chem. B, volume 102, pages 4096-4103 (1998)]; and with ZnS:Cu nano crystals have been reported by Huang et al. [see Appl. Phys. Lett., volume 70, pages 2335-2337 (1997)] all included herein by reference.

Photovoltaic Devices

According to a twenty-sixth embodiment of the layer configuration, according to the present invention, the layer configuration is a photovoltaic device.

According to a twenty-seventh embodiment of the layer configuration, according to the present invention, the layer configuration further comprises at least one photovoltaic layer. The photovoltaic layer may be organic layer, a hybrid inorganic and organic layer or an inorganic layer.

According to a twenty-eighth embodiment of the layer configuration, according to the present invention, the layer configuration is a solar cell.

Photovoltaic devices incorporating the layer configuration, according to the present invention, can be of two types: the regenerative type which converts light into electrical power leaving no net chemical change behind in which current-carrying electrons are transported to the anode and the external circuit and the holes are transported to the cathode where they are oxidized by the electrons from the external circuit and the photosynthetic type in which there are two redox systems one reacting with the holes at the surface of the semiconductor electrode and one reacting with the electrons entering the counter-electrode, for example, water is oxidized to oxygen at the semiconductor photoanode and reduced to hydrogen at the cathode. In the case of the regenerative type of photovoltaic cell, as exemplified by the Graetzel cell, the hole transporting medium may be a liquid electrolyte supporting a redox reaction, a gel electrolyte supporting a redox reaction, an organic hole transporting material, which may be a low molecular weight material such as 2,2',7,7'-tetrakis(N,N-di-p-methoxyphenyl-amine)9,9'-spirobifluorene (OMeTAD) or triphenylamine compounds or a polymer such as PPV-derivatives, poly(N-vinylcarbazole) etc., or inorganic semiconductors such as CuI, CuSCN etc. The charge transporting process can be ionic as in the case of a liquid electrolyte or gel electrolyte or electronic as in the case of organic or inorganic hole transporting materials.

Such regenerative photovoltaic devices can have a variety of internal structures in conformity with the end use. Conceivable forms are roughly divided into two types: structures which receive light from both sides and those which receive light from one side. An example of the former is a structure made up of a transparently conductive layer e.g. an ITO-layer or a PEDOT/PSS-containing layer and a transparent counter electrode electrically conductive layer e.g. an ITO-layer or a PEDOT/PSS-containing layer having interposed therebetween a photosensitive layer and a charge transporting layer. Such devices preferably have their sides sealed with a polymer, an adhesive or other means to prevent deterioration or volatilization of the inside substances. The external circuit connected to the electrically-conductive substrate and the counter electrode via the respective leads is well-known.

Organic photovoltaic layers of the layer configuration, according to the present invention are, for example, mixtures of fullerene molecules (as electron acceptor and electron transporter) with conjugated polymers (e.g. substituted polyphenylenevinylene (PPV) (as light absorber and hole transporter)[see Brabec et al., Adv. Funct. Mater., volume 11(1), pages 15-26 (2001)]. In 1995 Halls et al. reported in Nature, volume 376, page 498 the successful use of acceptor-type conjugated polymers instead of fullerenes.

Alternatively the layer configuration, according to the present invention, can be incorporated in hybrid photovoltaic compositions such as described in 1991 by Graetzel et al. in Nature, volume 353, pages 737-740, in 1998 by U. Bach et al. [see Nature, volume 395, pages 583-585 (1998)] and in 2002 by W. U. Huynh et al. [see Science, volume 295, pages 2425-2427 (2002)]. In all these cases, at least one of the components (light absorber, electron transporter or hole transporter) is inorganic (e.g. nano-$TiO_2$ as electron transporter, CdSe as light absorber and electron transporter) and at least one of the components is organic (e.g. triphenylamine as hole transporter or poly(3-hexylthiophene) as hole transporter).

Inorganic photovoltaic layers which can be used in the layer configuration according to this invention are described in EP-A 1 176 646.

Transistors

According to a twenty-ninth embodiment of the layer configuration, according to the present invention, the layer configuration further comprises a layer with one or more of the electron transporting or hole transporting components described above, but within such a configuration that it can be used as a transistor. The semiconductor can be n-type, p-type or both (ambipolar transistor) and can be either organic or inorganic.

INDUSTRIAL APPLICATION

Layer configurations comprising an element, according to the present invention, between a positive electrode and a material capable of hole transport and capable of reducing hole-electron recombination at the positive electrode can be used in a wide range of electronic devices such as photovoltaic devices, solar cells, batteries, capacitors, light emitting diodes, organic and inorganic electroluminescent devices, smart windows, electrochromic devices, sensors for organic and bio-organic materials and field effect transistors [see also chapter 10 of the Handbook of Oligo- and Polythiophenes, Edited by D. Fichou, Wiley-VCH, Weinheim (1999)].

The invention is illustrated hereinafter by way of reference light emitting devices and light emitting devices according to the present invention. The percentages and ratios given in these examples are by weight unless otherwise indicated.

Ingredients used in the element between the patterned ITO-electrode and the electroluminescent layer of reference light emitting devices:

| | |
|---|---|
| Celquat ™ SC240C | a cationic p-saccharide from National Starch and Chemical |
| Celquat ™ L200 | a cationic cellulose from National Starch and Chemical |

Light Emitting Devices 1 to 9

Preparation of the Electroluminescent ZnS:Cu dispersion

The following solutions were prepared:

| Solution 1 | zinc acetate dihydrate | 131.7 g |
| | copper acetate monohydrate | 0.54 g |
| | deionized water | to 600 mL |
| Solution 2 | sodium sulphide nonahydrate | 113.6 g |
| | ammonia (50%) | 5 mL |
| | deionized water | to 600 mL |
| Solution 3 | TRI* | 40 g |
| | deionized water | to 1000 mL |
| | sodium chloride | 58.44 g |

*TRI = (5-methyl-1,2,4-triazolo-(1,5-a)-pyrimidine-7-ol)

Solutions 1 and 2 at room temperature were added simultaneously both at a flow rate of 500 mL/min to solution 3, held at room temperature and stirred at 1500 rpm for 60 s. To 1000 mL of the resulting dispersion, 1000 mL of a 1% polyphosphoric acid solution adjusted to pH 6 with ammonium hydroxide was added and the dispersion was concentrated to 1000 mL by means ultrafiltration using a Fresenius F60 cartridge. This dispersion was subsequently diafiltered by using 5500 mL of a 1% solution of polyphosphoric acid solution adjusted to pH 6 with ammonium hydroxide solution in water. The dispersion was further concentrated to a volume of about 570 mL to produce an aqueous dispersion at pH 6 containing 30 g/L ZnS:Cu and 1% polyphosphoric acid. The dispersion was then ball-milled for 1 hour. 20 mL of the resulting dispersion was then ultrasonically treated with a ultrasound bar (Vibra cell VCX 400 W from Sonics & Materials Inc.—amplitude about 78%—output 40%) for 3 minutes while cooling in ice. 3.2 g of a 5% by weight aqueous solution of poly(vinylpyrrolidone) in water was then added to 16.8 g of the ZnS:Cu dispersion followed by further ultrasonic treatment with the ultrasound bar for 5 minutes. 0.5 mL of ZONYL™ FSO100 was then added as a 1% by weight aqueous solution followed by thorough stirring. The resulting dispersion was then filtered through a 5 μm MILLIPORE™ filter, a nano-dispersion of electroluminescent ZnS:Cu being thereby produced.

Preparation of the Patterned ITO Electrode

An indium tin oxide [ITO] layer on 175 μm thick poly(ethylene terephthalate) [PET] from IST, with a surface resistance of about 80 Ohm/square, was used as the hole-conducting electrode. ITO/PET sheets of 5×5 cm² were taped off in the middle of the plate with a 2 cm Magic tape Scotch 810 from 3M. The sides of the ITO plates were etched with a solution consisting of 50 mL of concentrated hydrochloric acid, 50 mL of deionized water and 4 mL of concentrated nitric acid. After the etching, the ITO/PET sheets were rinsed with water several times and subsequently dried with a hair dryer. After drying, the tape was removed and the sheets were put into a vessel with isopropanol which was put into an ultrasound bath for 10 minutes. Afterwards they were dried at 50° C. for 10 minutes. Each ITO/PET sheet contained a band of 2 cm of conductive ITO in the middle.

Preparation and Application of the Element between the Patterned ITO Electrode and the Electroluminescent Layer The solutions/dispersions were prepared by stirring the ingredients in Table 1 together in the quantities given therein and then adjusting the pH or not as indicated therein.

Solutions 4, 6, 8 and 10 were spincoated on patterned ITO/PET at 800 rpm for 6 s and then at 4000 rpm for 50 s. This resulted in an element thickness of about 5 to 10 nm. The substrates for devices 2, 4, 6 and 8 were thereby produced.

Solutions 5, 7, 9 and 11 were spincoated on patterned ITO/PET sheets at 800 rpm for 6 s and then at 1500 rpm for 50 s. This resulted in an element thickness of about 100 nm thereby producing the substrates for devices 3, 5, 7 and 9 respectively.

The thicknesses were measured with a DEKTAK™ profilometer with the element spincoated on glass. Similar element thicknesses can be expected on ITO/PET.

TABLE 1

| solution nr | polyacrylic acid [g] | 5% ZONYL FSO100 solution in H₂O [g] | deionized water [g] | pH adjustment? | with | end pH |
|---|---|---|---|---|---|---|
| 4 | 0.3 | 1 | 48.7 | yes | HCl | 3.5 |
| 5 | 0.65 | 1 | 48.35 | yes | HCl | 3.5 |
| 6 | 0.3 | 1 | 48.7 | no | — | 8.3 |
| 7 | 0.65 | 1 | 48.35 | no | — | 8.3 |
| 8 | 0.3 | 1 | 48.7 | yes | NaOH | 10 |
| 9 | 0.65 | 1 | 48.35 | yes | NaOH | 10 |
| 10 | 0.3 | 1 | 48.7 | yes | t-butylamine | 10 |
| 11 | 0.65 | 1 | 48.35 | yes | t-butylamine | 10 |

Application of the Electroluminescent Layer

The electroluminescent nano ZnS:Cu-dispersion was spincoated at 1000 rpm for 6 s and then at 2000 rpm for 50 s on the substrates of devices 1 to 9, device 1 without an elctron blocking element and devices 2 to 9 with the above-described electron blocking elements. The resulting electroluminescent ZnS:Cu-layers were then dried at 50° C. for 10 minutes, a thickness of 100 nm being thereby obtained.

Application of the Aluminium Electrode

Subsequently, a 160 nm thick aluminium electrode (cathode) was vacuum deposited on the spincoated double layers at a vacuum of $1.33 \times 10^{-4}$ N m$^{-2}$ Pa using a mask. The emission area was 25 mm². The device construction is shown in FIG. 1.

Performance of the Light Emitting Devices

The results of the light emitting devices produced without the additional layer between the patterned ITO-electrode and the ZnS:Cu luminescent layer, light emitting device 1, and with the different layers, light emitting devices 1 to 9, are given in Table 2.

It should be noted that the lifetime of these light emitting devices was found to be dependent upon the relative humidity pertaining at the time the devices were produced, decreasing with increasing ambient relative humidity. The lifetimes of reference devices without the additional element between the patterned ITO-electrode and the ZnS:Cu luminescent layer varied between 25 and 793 s during the research resulting in the present invention. Therefore, results from series of devices produced on different days can only be directly compared with one another, if the performances of the reference devices without the additional element between the patterned ITO-electrode and the ZnS:Cu luminescent layer were comparable.

At a forward bias, the devices exhibited electroluminescence with a λ max of 490 nm. For the lifetime measurements, a forward bias was applied and the voltage was increased so as to keep the light output constant at ca. 0.5 Cd/m². The maximum voltage was 12 V. The lifetime of the light emitting device was taken to be the time between the application of the optimum voltage and the moment no further electroluminescence could be observed. The optimum voltage was that voltage at which maximum light output was observed.

TABLE 2

| Device nr. | element | Counter-ion | pH | thickness of element [nm] | life-time [sec] | optimum voltage [V] |
| --- | --- | --- | --- | --- | --- | --- |
| 1 (ref.) | No | — | — | — | 623 | 6.4 |
| 2 (inv.) | PCP-01 | Na⁺ | 3.5 | 5 | 920 | 6.2 |
| 4 (inv.) | PCP-01 | Na⁺ | 8.3 | 5 | 890 | 6.3 |
| 6 (inv.) | PCP-01 | Na⁺ | 10 | 5 | 960 | 6.1 |
| 8 (inv.) | PCP-01 | t-butyl-ammonium | 10 | 5 | 1007 | 6.1 |
| 3 (inv.) | PCP-01 | Na⁺ | 3.5 | 100 | 760 | 6.2 |
| 5 (inv.) | PCP-01 | Na⁺ | 8.3 | 100 | 643 | 6.2 |
| 7 (inv.) | PCP-01 | Na⁺ | 10 | 100 | 1080 | 6.0 |
| 9 (inv.) | PCP-01 | t-butyl-ammonium | 10 | 100 | 1040 | 6.0 |

It can be concluded from Table 2 that the presence of an element containing a polycarboxy-polymer between the hole conductor (ITO) and the electroluminescent layer improves the lifetime of the devices. This can probably be explained by preventing electrons reaching the ITO layer. Indeed it was found that the (surface) resistance of the ITO after the lifetime experiments had substantially increased to greater than 1000 ohm/square, indicating that recombination of electrons and holes had taken place in the ITO layer. Furthermore, no significant difference in lifetime was found between 5 nm and 100 nm elements of polycarboxy-polymers.

Light Emitting Devices 10 to 16

Devices 10 to 16 were prepared as described for Devices 1 to 9 except that the patterned ITO electrode was coated with elements incorporating PAP-01. Solutions 12 to 17, used for preparing these elements, prepared as described for Solutions 1 to 11, are given below in Table 3.

TABLE 3

| solution nr | PAP-01 [g] | PAP-02 [g] | PAP-03 [g] | PAP-04 [g] | 5% ZONYL FSO100 in H₂O [g] | deionized water [g] | pH-adjustment acid | pH-adjustment to pH |
| --- | --- | --- | --- | --- | --- | --- | --- | --- |
| 12 | 0.65 | — | — | — | 1 | 48.35 | HCl | 2.5 |
| 13 | — | 0.65 | — | — | 1 | 48.35 | HCl | 2.5 |
| 14 | — | — | 0.3 | — | 1 | 48.7 | HTs | 2.5 |
| 15 | — | — | 0.3 | — | 1 | 48.7 | HCl | 2.5 |
| 16 | — | — | — | 0.3 | 1 | 48.7 | HTs | 2.5 |
| 17 | — | — | — | 0.3 | 1 | 48.7 | HBr | 2.5 |

Solutions 12 and 13 were spincoated on patterned ITO/PET at 800 rpm for 6 s and then at 1500 rpm for 50 s and the element dried at 40° C. for 10 minutes. This resulted in element thicknesses of about 100 nm, thereby producing the substrates for device 11 and 12 respectively.

Solutions 14, 15, 16 and 17 were spincoated on a patterned ITO/PET sheet at 800 rpm for 6 s and then at 4000 rpm for 50 s and the element dried at 40° C. for 10 minutes. This resulted in element thicknesses of about 5 to 10 nm, thereby producing the substrates for devices 13, 14, 15 and 16 respectively.

Performance of the Light Emitting Devices

The results for light emitting devices 10 to 16, obtained as for light emitting devices 1 to 9, are given in Table 4.

It can be concluded from Table 4 that the presence of an element containing a polyamine-polymer quaternized with HCl between the hole conductor (ITO) and the electroluminescent layer improves the lifetime of the devices with increasing element thickness in the cases of devices with elements of PAP-01 and PAP-02 for which at a thickness of 100 nm an improvement in lifetime over the reference device, device 10.

In the cases of devices with elements of PAP-03 and PAP-04, the performance of the devices is dependent upon the acid used to at least partially quaternize the polyamine-polymers. For PAP-03 there was an improvement for 5 nm elements in the case of quaternization with p-toluenesulphonic acid and hydrobromic acid. For PAP-04 there was an improvement for 5 nm elements in the case of quaternization with p-toluenesulphonic acid and hydrochloric acid.

TABLE 4

| Device nr. | element | counter-ion | pH | thickness of element [nm] | lifetime [sec] | optimum voltage [V] |
|---|---|---|---|---|---|---|
| 10 (ref.) | No | — | — | — | 650 | 6.2 |
| 11 (inv.) | PAP-01 | $Cl^-$ | 2.5 | 100 | 1820 | 5.8 |
| 12 (inv.) | PAP-02 | $Cl^-$ | 2.5 | 100 | 1570 | 9.8 |
| 13 (inv.) | PAP-03 | $pTs^-$ | 2.5 | 5 | 870 | 6.0 |
| 14 (inv.) | PAP-03 | $Cl^-$ | 2.5 | 5 | 757 | 6.1 |
| 15 (inv.) | PAP-04 | $pTs^-$ | 2.5 | 5 | 790 | 6.3 |
| 16 (inv.) | PAP-04 | $Br^-$ | 2.5 | 5 | 687 | 6.4 |

Light Emitting Devices 17 to 19

Devices 18 and 19 were prepared as described for Devices 2 to 9 except that the patterned ITO electrode was coated with elements incorporating poly(vinyl phosphonic acid). Solutions 18 and 19, used for preparing these elements, prepared as described for Solutions 4 to 11, are given below in Table 5.

TABLE 5

| solution nr | weight of polyvinyl phosphonic acid [g] | 5% ZONYL FSO100 in $H_2O$ [g] | deionized water [g] | solution pH |
|---|---|---|---|---|
| 18 | 0.3 | 1 | 48.7 | 1.4 |
| 19 | 0.65 | 1 | 48.35 | 1.4 |

Solution 18 was spincoated on patterned ITO/PET at 800 rpm for 6 s and then at 4000 rpm for 50 s and the elements dried at 40° C. for 10 minutes. This resulted in an element thickness of about 5 to 10 nm, thereby producing the substrate for device 18.

Solution 19 was spincoated on patterned ITO/PET sheets at 800 rpm for 6 s and then at 1500 rpm for 50 s and the elements dried at 40° C. for 10 minutes. This resulted in an element thickness of about 100 nm, thereby producing the substrate for device 19.

Performance of the Light Emitting Devices

The results for light emitting devices 18 and 19 obtained as for light emitting devices 1 to 9, are given in Table 6 together with the results of reference light emitting device 17 coated with the same batch of ZnS:Cu dispersion in the same series of coatings as devices 18 and 19.

TABLE 6

| Device nr. | element | pH | Thickness of element [nm] | Lifetime [s] | Optimum voltage [V] |
|---|---|---|---|---|---|
| 17 (ref.) | No | — | — | 25 | 8.0 |
| 18 (inv.) | poly (vinylphosphonic acid) | 1.4 | 5 | 220 | 6.0 |
| 19 (inv.) | poly (vinylphosphonic acid) | 1.4 | 100 | 35 | 5.8 |

It can be concluded from Table 6 that the presence of an element of poly(vinylphosphonic acid) between the hole conductor (ITO) and the electroluminescent layer improves the lifetime of the devices for both thicknesses of 5 nm and 100 nm. This can probably be explained by preventing electrons reaching the ITO layer. Indeed it was found that the (surface) resistance of the ITO after the lifetime experiments had substantially increased to greater than 1000 ohm/square, indicating that recombination of electrons and holes had taken place in the ITO layer.

Furthermore, devices with 5 nm and 100 nm poly(vinylphosphonic acid) elements exhibited a decrease in lifetime between element thicknesses of 5 nm and 100 nm.

Light Emitting Devices 20 to 22

Devices 20 to 22 were prepared as described for Devices 2 to 9 except that the patterned ITO electrode was coated with elements incorporating polyacrylamide. Solutions 20 and 21, used for preparing these elements, prepared as described for Solutions 4 to 11, are given below in Table 7.

TABLE 7

| solution nr | weight of polyacrylamide [g] | 5% ZONYL FSO100 in $H_2O$ [g] | deionized water [g] | pH adjusted with HCl to |
|---|---|---|---|---|
| 20 | 0.3 | 1 | 48.7 | 2.5 |
| 21 | 0.65 | 1 | 48.35 | 2.5 |

Solution 20 was spincoated on patterned ITO/PET at 800 rpm for 6 s and then at 4000 rpm for 50 s and the elements dried at 40° C. for 10 minutes. This resulted in an element thickness of about 5 to 10 nm, thereby producing the substrate for device 21.

Solution 21 was spincoated on patterned ITO/PET sheets at 800 rpm for 6 s and then at 1500 rpm for 50 s and the elements dried at 40° C. for 10 minutes. This resulted in an element thickness of about 100 nm, thereby producing the substrate for device 22.

Performance of the Light Emitting Devices

The results for light emitting devices 21 and 22 obtained as for light emitting devices 1 to 9, are given in Table 8 together with the results of the reference light emitting device 20 coated with the same batch of ZnS:Cu dispersion in the same series of coatings as devices 21 and 22.

TABLE 8

| Device nr. | element | counter-ion | pH | Thickness of element [nm] | Lifetime [s] | Optimum voltage [V] |
|---|---|---|---|---|---|---|
| 20 (ref.) | No | — | — | — | 793 | 6.3 |
| 21 (comp.) | polyacrylamide | Cl⁻ | 2.5 | 5 | 137 | 7.1 |
| 22 (comp.) | polyacrylamide | Cl⁻ | 2.5 | 100 | 5 | 7.0 |

It can be concluded from Table 8 that the presence of an element of polyacrylamide between the hole conductor (ITO) and the electroluminescent layer worsened the lifetime of the devices for both thicknesses of 5 nm and 100 nm. This shows that not all polymer elements incorporated between the patterned ITO-electrode and the ZnS:Cu electroluminescent layer exhibit a beneficial effect on the lifetime of such devices.

Light Emitting Devices 23 to 26

Devices 23 to 26 were prepared as described for Devices 2 to 9 except that the patterned ITO electrode was coated with elements incorporating polyacrylamide. Solutions 22 to 25, used for preparing these elements, prepared as described for Solutions 1 to 11, are given below in Table 9.

TABLE 9

| solution nr | wt of Celquat SC240C [g] | wt of Celquat L200 [g] | 5% ZONYL FSO100 in H$_2$O [g] | deionized water [g] | pH adjusted with HCl to |
|---|---|---|---|---|---|
| 22 | 0.3 | — | 1 | 48.7 | 2.5 |
| 23 | 0.65 | — | 1 | 48.35 | 2.5 |
| 24 | — | 0.3 | 1 | 48.7 | 2.5 |
| 25 | — | 0.65 | 1 | 48.35 | 2.5 |

Solutions 22 and 24 were spincoated on patterned ITO/PET at 800 rpm for 6 s and then at 4000 rpm for 50 s and the elements dried at 40° C. for 10 minutes. This resulted in element thicknesses of about 5 to 10 nm, thereby producing the substrates for devices 23 and 25 respectively.

Solutions 23 and 25 were spincoated on patterned ITO/PET sheets at 800 rpm for 6 s and then at 1500 rpm for 50 s and the elements dried at 40° C. for 10 minutes. This resulted in element thicknesses of about 100 nm, thereby producing the substrates for devices 24 and 26 respectively.

Performance of the Light Emitting Devices

The results for light emitting devices 23 to 26, obtained as for light emitting devices 1 to 9, are given in Table 10 together with the results of reference light emitting device 10, which was coated with the same batch of ZnS:Cu dispersion in the same series of coatings as devices 23 to 26.

It can be concluded from Table 10 that the presence of an element of Celquat™ SC240C and Celquat™ L200, a cationic p-saccharide and a cationic cellulose respectively, between the hole conductor (ITO) and the electroluminescent layer worsened the lifetime of the devices for both thicknesses of 5 nm and 100 nm. This shows that not all polymer elements incorporated between the patterned ITO-electrode and the ZnS:Cu electroluminescent layer exhibit a beneficial effect on the lifetime of such devices.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now-be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by con-

TABLE 10

| Device nr. | element | counter-ion | pH | Thickness of element [nm] | Lifetime [s] | Optimum voltage [V] |
|---|---|---|---|---|---|---|
| 10 (ref.) | No | — | — | — | 650 | 6.2 |
| 24 (comp.) | Celquat ™ SC240C | Cl⁻ | 2.5 | 5 | 290 | 6.5 |
| 25 (comp.) | Celquat ™ SC240C | Cl⁻ | 2.5 | 100 | 5 | 6.2 |
| 26 (comp.) | Celquat ™ L200 | Cl⁻ | 2.5 | 5 | 168 | 6.2 |
| 27 (comp.) | Celquat ™ L200 | Cl⁻ | 2.5 | 100 | 1 | — | text. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

I claim:

1. A layer configuration on a support, said layer configuration comprising a non-photoactive element exclusive of unsubstituted poly(3,4-alkylenedioxythiophene)s and conductive polymers, said element comprising at least one polymer selected from the group consisting of polycarboxy-polymers, optionally quaternized polyamine-polymers and poly(vinylphosphonic acid), the surface of one side of said element being contiguous with a positive electrode and the surface on the opposite side of said element being contiguous with a material capable of transporting holes.

2. The layer configuration according to claim 1, wherein said polycarboxy-polymer is a polymer comprising optionally substituted acrylic acid monomer units.

3. The layer configuration according to claim 2, wherein said optionally substituted acrylic acid monomer units are selected from the group consisting of: acrylic acid, methacrylic acid, maleic acid, fumaric acid, itaconic acid, glutaconic acid and citraconic acid.

4. The layer configuration according to claim 1, wherein said polycarboxy-polymer is polyacrylic acid or polymethacrylic acid.

5. The layer configuration according to claim 1, wherein said optionally quaternized polyamine-polymer is polyallylamine hydrochloride, an optionally quaternized polyvinylpyridine or a copolymer of an optionally quaternized vinyl pyridine.

6. An electroluminescent device consisting of a layer configuration on a support, said layer configuration comprising a non-photoactive element exclusive of unsubstituted poly(3,4-alkylenedioxythiophene)s and conductive polymers, said element comprising at least one polymer selected from the group consisting of polycarboxy-polymers, optionally quaternized polyamine-polymers and poly(vinylphosphonic acid), the surface of one side of said element being contiguous with a positive electrode and the surface on the opposite side of said element being contiguous with a material capable of transporting holes.

7. The electroluminescent device according to claim 6, wherein said polycarboxy-polymer is a polymer containing optionally substituted acrylic acid monomer units.

8. The electroluminescent device according to claim 7, wherein said optionally substituted acrylic acid monomer units are selected from the group consisting of: acrylic acid, methacrylic acid, maleic acid, fumaric acid, itaconic acid, glutaconic acid and citraconic acid.

9. The electroluminescent device according to claim 6, wherein said polycarboxy-polymer is polyacrylic acid or polymethacrylic acid.

10. The electroluminescent device according to claim 6, wherein said optionally quaternized polyamine-polymer is polyallylamine hydrochloride, an optionally quaternized polyvinylpyridine or a copolymer of an optionally quaternized vinyl pyridine.

* * * * *